(12) United States Patent
Kawakami

(10) Patent No.: US 12,057,479 B2
(45) Date of Patent: *Aug. 6, 2024

(54) SEMICONDUCTOR DEVICE HAVING A JUNCTION PORTION CONTACTING A SCHOTTKY METAL

(71) Applicant: ROHM CO., LTD., Kyoto (JP)

(72) Inventor: Yasuhiro Kawakami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/169,679

(22) Filed: Feb. 15, 2023

(65) Prior Publication Data

US 2023/0197791 A1 Jun. 22, 2023

Related U.S. Application Data

(63) Continuation of application No. 17/228,189, filed on Apr. 12, 2021, now Pat. No. 11,610,970, which is a
(Continued)

(30) Foreign Application Priority Data

Jun. 6, 2012 (JP) .................................. 2012-129219

(51) Int. Cl.
*H01L 29/16* (2006.01)
*H01L 21/04* (2006.01)
(Continued)

(52) U.S. Cl.
CPC ...... *H01L 29/1608* (2013.01); *H01L 21/0495* (2013.01); *H01L 29/417* (2013.01);
(Continued)

(58) Field of Classification Search
CPC . H01L 29/1608; H01L 21/0495; H01L 29/47; H01L 29/417; H01L 29/872;
(Continued)

(56) References Cited

U.S. PATENT DOCUMENTS 7,851,881 B1 * 12/2010 Zhao .................. H01L 29/0619
257/155
10,170,562 B2 1/2019 Kawakami
(Continued)

FOREIGN PATENT DOCUMENTS

EP 1739753 A1 1/2007
EP 2383784 11/2011
(Continued)

OTHER PUBLICATIONS

Decision of Refusal issued for Japanese Patent Application No. 2021-191322, Dispatch Date: Apr. 27, 2023, 6 pages Including English machine translation.
(Continued)

*Primary Examiner* — Changhyun Yi
(74) *Attorney, Agent, or Firm* — XSENSUS LLP

(57) ABSTRACT

A semiconductor device according to the present invention includes a first conductive-type SiC semiconductor layer, and a Schottky metal, comprising molybdenum and having a thickness of 10 nm to 150 nm, that contacts the surface of the SiC semiconductor layer. The junction of the SiC semiconductor layer to the Schottky metal has a planar structure, or a structure with recesses and protrusions of equal to or less than 5 nm.

20 Claims, 12 Drawing Sheets

Related U.S. Application Data continuation of application No. 16/786,686, filed on Feb. 10, 2020, now Pat. No. 11,004,939, which is a continuation of application No. 16/196,623, filed on Nov. 20, 2018, now Pat. No. 10,600,873, which is a continuation of application No. 15/707,662, filed on Sep. 18, 2017, now Pat. No. 10,170,562, which is a continuation of application No. 14/406,106, filed as application No. PCT/JP2013/065603 on Jun. 5, 2013, now Pat. No. 9,799,733.

(51) Int. Cl.
  *H01L 29/417* (2006.01)
  *H01L 29/47* (2006.01)
  *H01L 29/66* (2006.01)
  *H01L 29/872* (2006.01)

(52) U.S. Cl.
  CPC ........ *H01L 29/47* (2013.01); *H01L 29/66143* (2013.01); *H01L 29/872* (2013.01); *H01L 2224/02166* (2013.01); *H01L 2224/04042* (2013.01); *H01L 2224/05083* (2013.01); *H01L 2224/05139* (2013.01); *H01L 2224/05155* (2013.01); *H01L 2224/05166* (2013.01); *H01L 2224/05552* (2013.01); *H01L 2224/05558* (2013.01); *H01L 2224/05567* (2013.01); *H01L 2224/05583* (2013.01); *H01L 2224/05624* (2013.01); *H01L 2224/05644* (2013.01); *H01L 2224/05666* (2013.01); *H01L 2224/0568* (2013.01); *H01L 2224/06181* (2013.01); *H01L 2924/10272* (2013.01); *H01L 2924/12032* (2013.01); *H01L 2924/351* (2013.01)

(58) Field of Classification Search
  CPC ..... H01L 2224/05083; H01L 29/66143; H01L 2224/02166; H01L 2224/04042; H01L 2924/351
  See application file for complete search history.

(56) References Cited

U.S. PATENT DOCUMENTS

| | | | |
|---|---|---|---|
| 10,600,873 | B2 | 3/2020 | Kawakami |
| 11,004,939 | B2 | 5/2021 | Kawakami |
| 11,610,970 | B2 * | 3/2023 | Kawakami .......... H01L 21/0495 |
| 2005/0077591 | A1 | 4/2005 | Fukuda et al. |
| 2006/0065899 | A1 | 3/2006 | Hatakeyama et al. |
| 2006/0086939 | A1 | 4/2006 | Carta et al. |
| 2006/0118792 | A1 | 6/2006 | Ryu et al. |
| 2006/0273323 | A1 | 12/2006 | Yamamoto et al. |
| 2007/0134897 | A1 | 6/2007 | Nakamura et al. |
| 2008/0237608 | A1 | 10/2008 | Richieri |
| 2009/0001382 | A1 | 1/2009 | Ohta et al. |
| 2009/0236611 | A1 | 9/2009 | Yamamoto et al. |
| 2009/0243026 | A1 | 10/2009 | Nakamura et al. |
| 2011/0204383 | A1 | 8/2011 | Yamamoto et al. |
| 2011/0309469 | A1 | 12/2011 | Grebs |
| 2012/0115319 | A1 | 5/2012 | Mieczkowski et al. |
| 2012/0228633 | A1 | 9/2012 | Hatakeyama |
| 2012/0241898 | A1 | 9/2012 | Ohta et al. |
| 2013/0062619 | A1 | 3/2013 | Henning et al. |

FOREIGN PATENT DOCUMENTS

| | | |
|---|---|---|
| JP | H0955498 | 2/1997 |
| JP | H10-125936 | 5/1998 |
| JP | 2003347540 | 12/2003 |
| JP | 2004303853 | 10/2004 |
| JP | 2005079339 | 3/2005 |
| JP | 2005311347 | 11/2005 |
| JP | 2006086183 | 3/2006 |
| JP | 2006344688 | 12/2006 |
| JP | 2007149839 | 6/2007 |
| JP | 2008103436 | 5/2008 |
| JP | 2008518445 | 5/2008 |
| JP | 2009524217 | 6/2009 |
| JP | 2009200278 | 9/2009 |
| JP | 2009231321 | 10/2009 |
| JP | 2009545885 | 12/2009 |
| JP | 2010157547 | 7/2010 |
| JP | 2010225914 | 10/2010 |
| JP | 2010232627 | 10/2010 |
| JP | 2011009797 | 1/2011 |
| JP | 2011023508 | 2/2011 |
| JP | 2011165880 | 8/2011 |
| JP | 2011176015 | 9/2011 |
| JP | 2011258662 | 12/2011 |
| JP | 2012/064636 | 5/2012 |

OTHER PUBLICATIONS

"TEM to STEM no Chigai (Tsukaiwake ni Tsuite)," [online], 2010, Nano Science Kabushiki Kaisha, [retrieval date Aug. 30, 2013 (Aug. 30, 2013)], <URL: http://www.nanoscience.co.jp/knowledge/TEM/knowledge01.html>, 1 page (concise explanation of relevance discussed in International Search Report).

Takashi Katsuno et al., "Analysis of surface morphology at leakage current sources of 4H-SiC Schottky barrier diodes," Applied Physics Letters (2011), vol. 98, No. 222111, 3 pages.

A Latreche et al., "Electrical characteristics of Mo/4H-SiC Schottky diodes having ion-implanted guard rings: temperature and implant-dose dependence," Semicond. Sci. Technol (2011), vol. 26, No. 085003, 9 pages.

The partial Supplemental European Search Report for European Patent Application No. 13800292.8, dated Jan. 19, 2016, 10 pages.

Office Action issued for corresponding Japanese Patent Application No. 2014-520030, dated Jan. 12, 2017, 9 pages including English translation.

Office Action issued for corresponding Japanese Patent Application No. 2014-520030, dated Jul. 6, 2017, 6 pages including English translation.

Office Action issued in corresponding European Patent Application No. 13800292.8, May 4, 2018, 5 pages.

Office Action issued for Japanese Patent Application No. 2017-194448, dated Jul. 19, 2018, 6 pages including English translation.

Office Action issued for Japanese Patent Application No. 2017-194448, Dispatch Date: Feb. 21, 2019, 7 pages including English translation.

Result of Consultation issued for European Patent Application No. 13800292.8, dated Jul. 1, 2019, 4 pages.

Office Action issued for Japanese Patent Application No. 2017-194448, Dispatch Date: Sep. 19, 2019, 8 pages Including English machine translation.

Office Action issued for Japanese Patent Application No. 2020-062540, Dispatch Date: Mar. 25, 2021, 12 pages including English machine translation.

Invitation pursuant to Rule 63(1) EPC issued for European Patent Application No. 22166443.6, dated Jun. 22, 2022, 8 pages.

Extended European Search Report issued for European Patent Application No. 22166443.6, dated Oct. 5, 2022, 22 pages.

Notice of Reasons for Refusal issued in corresponding Japanese Patent Application No. 2021-191322, Nov. 17, 2022, 14 pages w/translation.

European Communication pursuant to Article 94(3) EPC issued Mar. 5, 2024 in corresponding European Patent Application No. 22166443.6, 8 pages.

* cited by examiner

Reference Example 1

Flat structure

Comparative Example 1

SEMICONDUCTOR DEVICE HAVING A JUNCTION PORTION CONTACTING A SCHOTTKY METAL

TECHNICAL FIELD

The present invention relates to a semiconductor device provided with a Schottky barrier diode made of SiC and a method of manufacturing the same.

BACKGROUND ART

Conventionally, attention is paid to a semiconductor power device used mainly for a system in various types of fields of power electronics such as a motor control system and a power conversion system. As a semiconductor power device, an SiC Schottky barrier diode is well-known (for example, Patent Documents 1 and 2).

CITATION LIST

Patent Literature

Patent Document 1: Japanese Patent Application Publication No. 2005-79339
Patent Document 2: Japanese Patent Application Publication No. 2011-9797

SUMMARY OF INVENTION

Technical Problem

An object of the present invention is to provide a semiconductor device capable of reducing forward voltage while suppressing a reverse leakage current to a comparable level as in the conventional technology and decreasing a variation in the reverse leakage current, and to provide a method of manufacturing the same.

Solution to Problem

The semiconductor device of the present invention includes a first conductive-type sic semiconductor layer, and a Schottky metal being made of molybdenum contacting a surface of the SiC semiconductor layer and having a thickness of 10 nm to 150 nm, in which the SiC semiconductor layer has a first junction portion contacting the Schottky metal and the first junction portion is a flat structure or a structure having unevenness of 5 nm or less.

According to the arrangement, the first junction portion of the SiC semiconductor layer to the Schottky metal is a flat structure or a structure having unevenness of 5 nm or less. This reduces forward voltage while suppressing a reverse leakage current to a comparable level as in the conventional technology.

Further, in this structure, a thickness of the Schottky metal made of molybdenum is 10 nm to 150 nm, and thus, the stress applied to the SiC semiconductor layer from the Schottky metal can be alleviated and a variation in the stress can be decreased. Thus, when the semiconductor device of the present invention is mass-produced, it is possible to decrease a variation in the reverse leakage current. As a result, it is possible to stably supply a semiconductor device having quality in which the reverse leakage current stays within a constant range. When the thickness of the Schottky metal is 10 nm to 100 nm, it is possible to further decrease the variation in the reverse leakage current.

It is preferable that the Schottky metal has a single crystalline structure of which the crystalline interface is not exposed in a vertical cross section. According to the arrangement, it is possible to make uniform a characteristic of the entire Schottky metal.

It is preferable that the semiconductor device includes an anode electrode formed on the Schottky metal, and the anode electrode includes a second junction portion made of a titanium layer contacting the Schottky metal. In that case, the anode electrode may include an aluminum layer formed on the titanium layer.

It is preferable that the semiconductor device includes a nickel contact layer contacting a back surface of the SiC semiconductor layer.

The semiconductor device may include a cathode electrode including a titanium layer formed on the nickel contact layer. In that case, an alloy layer may be further formed which contains titanium and carbon between the nickel contact layer and the cathode electrode.

The semiconductor device may further include a carbon layer formed on the nickel contact layer.

The semiconductor device may include a second conductive-type guard ring formed to surround the first junction portion. In that case, the SiC semiconductor layer may be made of n-type SiC and the guard ring may be made of p-type SiC.

It is preferable that the guard ring is formed to extend outward with respect to an outer circumferential edge of the Schottky metal.

When a load connected to the semiconductor device is inductive, if a current passing through the load is blocked, then counter-electromotive force generated to the load. Resulting from the counter-electromotive force, reverse voltage in which the anode side is positive may apply between an anode and a cathode. In such a case, it is possible to relatively decrease a resistance value of the guard ring, and thus, it is possible to suppress heat generated by the current passing within the guard ring. As a result, it is possible to prevent a device from being thermally destroyed. That is, it is possible to improve an inductive load resistance (L load resistance).

Further, it is preferable that when the semiconductor device includes a field insulating film formed on a surface of the SiC semiconductor layer, the field insulating film formed therein with an opening through which the first junction portion and an inner peripheral portion of the guard ring are selectively exposed, the Schottky metal is joined to the SiC semiconductor layer within the opening and rides on the field insulating film by a riding amount of 10 μm to 60 μm from a circumferential edge of the opening.

According to the arrangement, when the reverse voltage is applied between the anode and the cathode as described above, it is possible to shorten a distance over which a current passes within the guard ring, and thus, it is possible to suppress heat generated by the current. As a result, it is possible to prevent a device from being thermally destroyed.

Therefore, when a dopant concentration of the guard ring and the riding amount on the field insulating film in the Schottky metal are combined, it is possible to realize an excellent inductive load resistance (L load resistance).

The Schottky metal may be formed so that an outer circumferential edge thereof contacts the guard ring.

A method of manufacturing a semiconductor device according to the present invention includes a step of forming a Schottky metal made of molybdenum having a thickness of 10 nm to 150 nm, on a surface of a first conductive-type SiC semiconductor layer, and a step of performing a heat treatment on the Schottky metal in a state where the surface of the Schottky metal is exposed so that a first junction portion with the Schottky metal in the SiC semiconductor layer is made a flat structure or a structure having unevenness of 5 nm or less.

According to the method, the first junction portion of the SiC semiconductor layer to the Schottky metal is made a flat structure or a structure having unevenness of 5 nm or less. This provides a semiconductor device capable of reducing forward voltage while suppressing a reverse leakage current to a comparable level as in the conventional technology.

Further, in this structure, a thickness of the Schottky metal made of molybdenum is 10 nm to 150 nm, and thus, the stress applied to the SiC semiconductor layer from the Schottky metal can be alleviated and a variation in the stress can be decreased. Thus, when the semiconductor device obtained by the method is mass-produced, it is possible to decrease a variation in the reverse leakage current. As a result, it is possible to stably supply a semiconductor device having quality in which the reverse leakage current stays within a constant range.

It is preferable that the step of performing a heat treatment on the SiC semiconductor layer is executed in an atmosphere where oxygen is not present. Specifically, it is preferable that the step of performing a heat treatment on the SiC semiconductor layer is executed in a nitrogen atmosphere. In that case, it is preferable that the step of performing a heat treatment on the SiC semiconductor layer is executed in a resistance heat furnace.

According to these methods, it is possible to prevent an oxidation of the Schottky metal (molybdenum) during the heat treatment and deterioration of a surface portion of the Schottky metal into a molybdenum oxide.

It is preferable that the method of manufacturing a semiconductor device includes a step of forming an anode electrode on the Schottky metal, and in the step of forming the anode electrode, a titanium layer is formed so as to contact the Schottky metal. In that case, the step of forming the anode electrode may include a step of forming an aluminum layer so as to contact the titanium layer.

Further, it is preferable that the method of manufacturing a semiconductor device includes a step of forming a nickel contact layer on a back surface of the SiC semiconductor layer before the formation of the Schottky metal and performing a heat treatment on the nickel contact layer.

DETAILED DESCRIPTION OF EMBODIMENTS

Embodiments of the present invention will hereinafter be described in detail with reference to the accompanying drawings.

Figure 1:
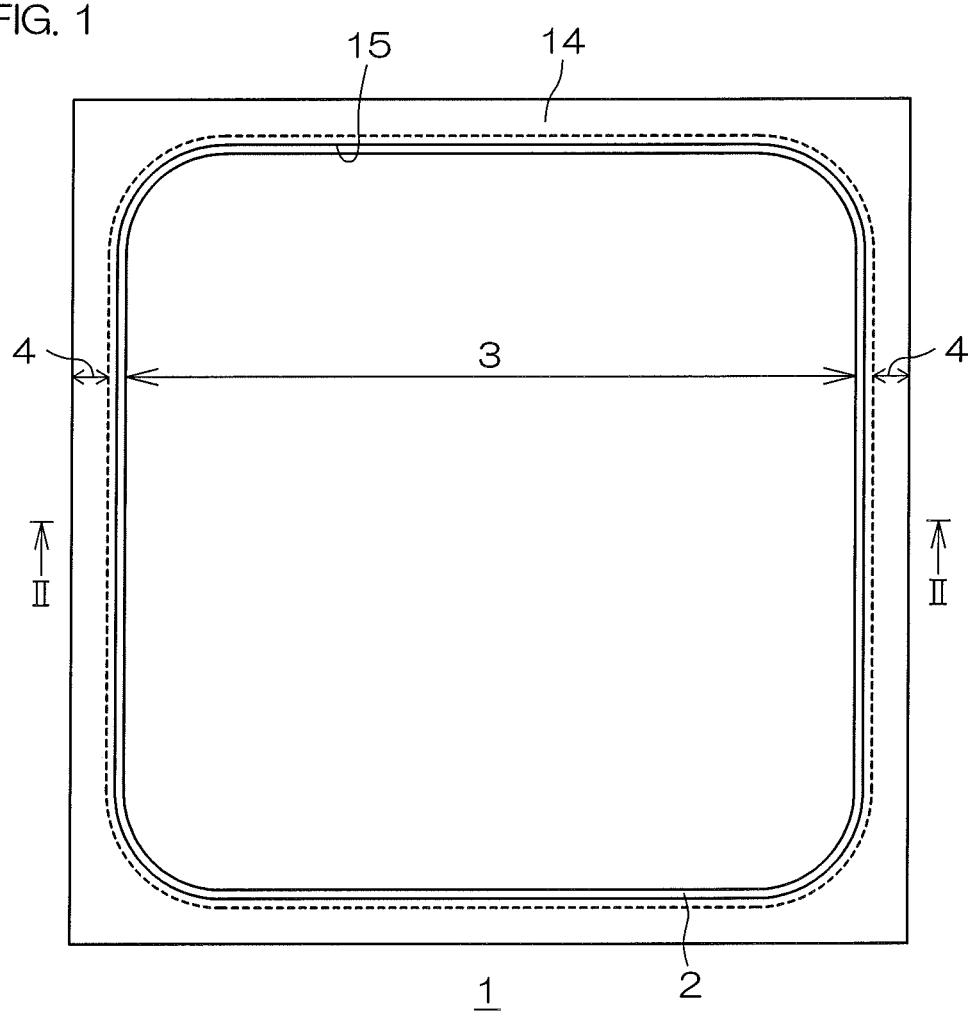
FIG. 1 is a plan view of a semiconductor device according to a embodiment of the present invention.
Figure 2:
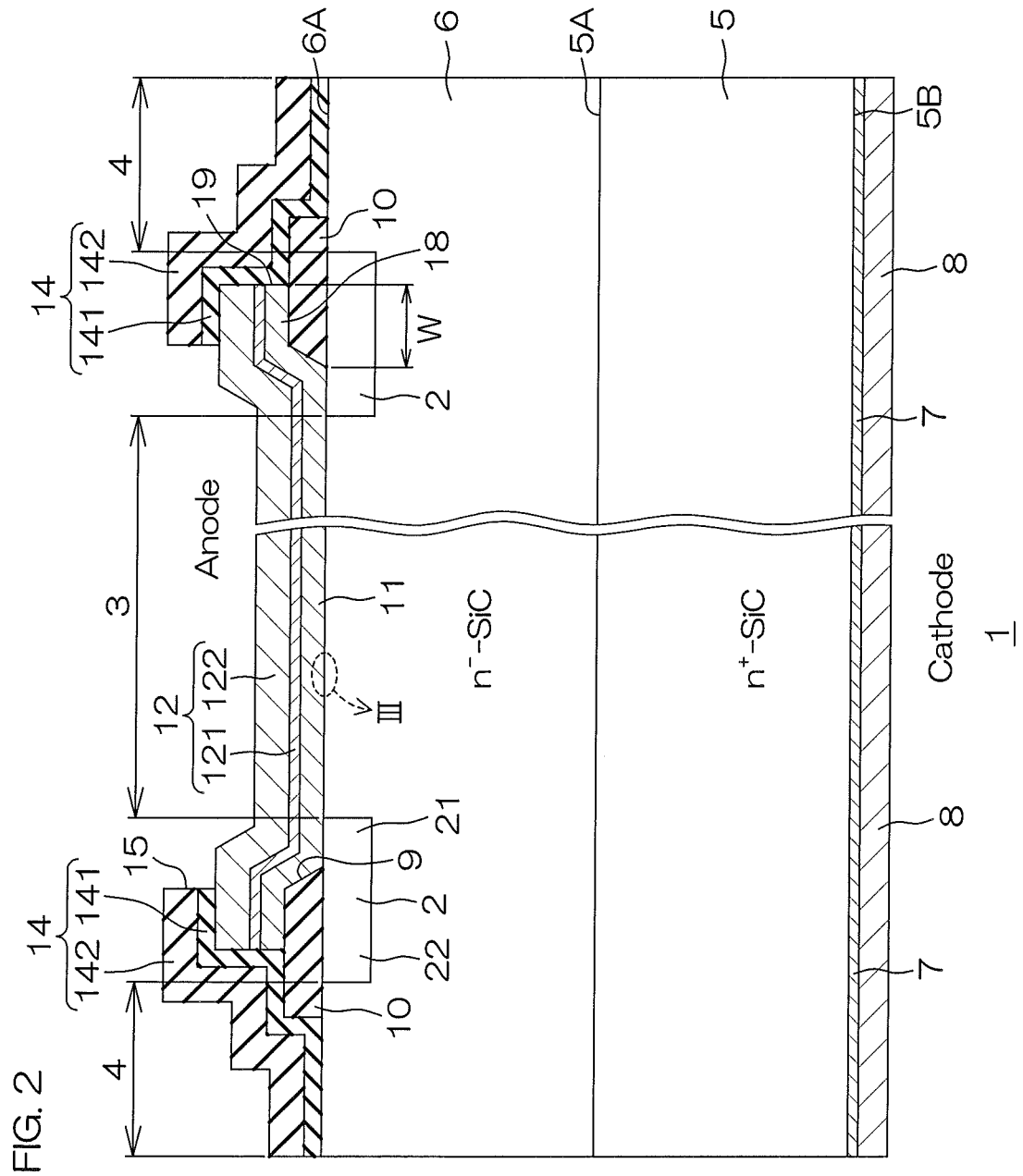
FIG. 2 is a cross-sectional view taken along a cutting plane line II-II in FIG. 1.
Figure 3:
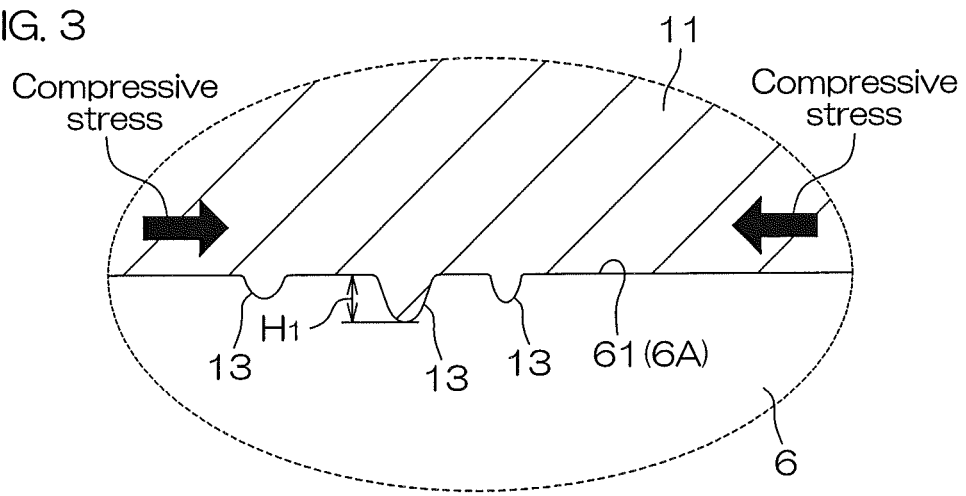
FIG. 3 is an enlarged view of a portion within a broken line circle in FIG. 2.

FIG. 1 is a plan view of a semiconductor device according to a embodiment of the present invention. FIG. 2 is a cross-sectional view taken along a cutting plane line II-II in FIG. 1. FIG. 3 is an enlarged view of a portion within a broken line circle in FIG. 2.

A semiconductor device 1 includes an element in which SiC is adopted, and is of a squared chip shape in a plan view, for example. The semiconductor device 1 may be of a rectangular shape in a plan view. The size of the semiconductor device 1 has 0.5 mm to 20 mm in the respective vertical and horizontal lengths in the sheet of FIG. 1. That is, the chip size of the semiconductor device 1 is 0.5 mm square to 20 mm square, for example.

The surface of the semiconductor device 1 is divided by an annular guard ring 2 into an active region 3 inside the guard ring 2 and an outer circumferential region 4 outside the guard ring 2. The guard ring 2 is a semiconductor layer containing a p-type dopant, for example. As the dopant to be contained, B (boron), Al (aluminum), Ar (argon), etc., may be used. The depth of the guard ring 2 may be about 100 nm to 1000 nm.

With reference to FIG. 2, the semiconductor device 1 includes a substrate 5 made of n$^+$-type SiC and a drift layer 6 made of n$^-$-type SiC laminated on a surface 5A of the substrate 5. In the embodiment, the substrate 5 and the drift layer 6 are shown as one example of the SiC semiconductor layer of the present invention.

The thickness of the substrate 5 may be 50 μm to 600 μm, and the thickness of the drift layer 6 thereon may be 3 μm to 100 μm. As an n-type dopant contained in the substrate 5 and the drift layer 6, N (nitrogen), P (phosphorus), As (arsenic), etc., may be used. As for a relationship in dopant concentration between the substrate 5 and the drift layer 6, the dopant concentration of the substrate 5 is relatively higher, and the dopant concentration of the drift layer 6 is relatively lower than that of the substrate 5. Specifically, the dopant concentration of the substrate 5 may be $1\times10^{18}$ to $1\times10^{20}$ cm$^{-3}$, and the dopant concentration of the drift layer 6 may be $5\times10^{14}$ to $5\times10^{16}$ cm$^{-3}$.

On a back surface 5B ((000-1) C plane, for example) of the substrate 5, a nickel (Ni) contact layer 7 is formed to cover the entire back surface 5B. On the nickel contact layer 7, a cathode electrode 8 is formed. The nickel contact layer 7 is made of a nickel containing metal forming an ohmic junction with the substrate 5. Such a metal may include a nickel silicide layer, for example. In the cathode electrode 8, a structure (Ti/Ni/Au/Ag) is formed in which titanium (Ti), nickel (Ni), gold (Au), and silver (Ag) are laminated in order from the nickel contact layer 7 side, for example, and an Ag layer is exposed to the topmost surface.

On a surface 6A ((0001) Si plane, for example) of the drift layer 6, a field insulating film 10 is formed which has a contact hole 9 through which one portion of the drift layer 6, as the active region 3, is exposed and covers the outer circumferential region 4 surrounding the active region 3.

The field insulating film 10 may be arranged by SiO$_2$ (silicon oxide), for example. A film thickness of the field insulating film 10 may be 0.5 µm to 3 µm.

On the field insulating film 10, Schottky metal 11 and an anode electrode 12 are laminated.

The Schottky metal 11 contacts, via the contact hole 9, the surface 6A of the drift layer 6, and forms a Schottky barrier with the drift layer 6. Specifically, the Schottky metal 11 is made of molybdenum (Mo), and has a thickness of 10 nm to 150 nm. The Schottky metal 11 is embedded in the contact hole 9 and rides on the field insulating film 10 to cover a circumferential edge portion of the contact hole 9 in the field insulating film 10 from above. More specifically, the Schottky metal 11 preferably rides on the field insulating film 10 so that the guard ring 2 extends (projects) outward with respect to an outer circumferential edge 19 of the Schottky metal 11. In order that the guard ring 2 is projected outward, for example, a width W (riding amount) from a circumferential edge of the hole 9 of a portion that rides on the field contact insulating film 10 (riding portion 18) of the Schottky metal 11 to the outer circumferential edge 19 preferably is 10 µm to 60 µm. It is noted that in the embodiment, the circumferential edge of the contact hole 9 indicates a position at which the thickness of the field insulating film 10 is 0 (zero). Therefore, for example, when the contact hole 9 is formed in a tapered shape in which the diameter is narrower from the upper end to the lower end, the width W is measured from the lower end of the circumferential edge of the contact hole 9.

The Schottky metal 11 is relatively thin, that is, 10 nm to 150 nm, and therefore, in the Schottky metal 11, it is possible to decrease a step between an upper portion that rides on the field insulating film 10 and a lower portion contacting the surface 6A of the drift layer 6. This decreases the step in the topmost surface of the anode electrode 12, and therefore, it is possible to easily join a bonding wire to the topmost surface.

The Schottky metal 11 may have a single crystalline structure of which the crystalline interface is not exposed in a vertical cross section. Whether or not the Schottky metal 11 is of single crystalline structure can be confirmed by photographing and observing an image of a cross section of the Schottky metal 11 by using TEM (Transmission Electron Microscope), for example. With the arrangement, it is possible to make uniform a characteristic of the entire Schottky metal 11.

As shown in FIG. 3 here, when an uneven structure 13 is formed in a junction portion 61 (one portion of the surface 6A) of the drift layer 6 to the Schottky metal 11, a height H$_1$ of the uneven structure 13 is 5 nm or less. As in FIG. 3, when a plurality of recessed portions are formed in the uneven structure 13, the height H$_1$ of the uneven structure 13 may adopt a depth at the deepest recessed portion. It is noted that the embodiment shows an example where the uneven structure 13 is formed in the junction portion 61, and the junction portion 61 of the semiconductor device 1 may be a flat structure where the unevenness is scarcely present.

The anode electrode 12 may be of a two-layered structure including a titanium layer 121 formed on the Schottky metal 11 and an aluminum layer 122 formed on the titanium layer 121. The anode electrode 12 is a portion which is exposed to the topmost surface of the semiconductor device 1 and to which a bonding wire, etc., are joined. Similar to the Schottky metal 11, the anode electrode 12 rides on the field insulating film 10 to cover a circumferential edge portion of the contact hole 9 in the field insulating film 10 from above. Preferably, the titanium layer 121 has a thickness of 70 nm to 230 nm, and the aluminum layer 122 has a thickness of 3.2 µm to 5.2 µm (4.2 µm, for example). More particularly, the titanium layer 121 may be of a two-layered structure including a lower layer, that is, Ti, and an upper layer, that is, TiN. At this time, a thickness of Ti is 10 nm to 40 nm (25 nm, for example), and a thickness of TiN is 60 nm to 190 nm (130 nm, for example).

The guard ring 2 dividing the drift layer 6 into the active region 3 and the outer circumferential region 4 is formed along the profile of the contact hole 9 to cross over the inside and outside of the contact hole 9 in the field insulating film 10 (to cross over the active region 3 and the outer circumferential region 4). Therefore, the guard ring 2 has an inside portion 21 (inner peripheral portion) that projects inward of the contact hole 9 and contacts a terminal end portion of the Schottky metal 11 within the contact hole 9, and an outside portion 22 that projects outward of the contact hole 9 and faces the Schottky metal 11 with the circumferential edge portion of the field insulating film 10 being interposed therebetween.

On the topmost surface of the semiconductor device 1, a surface protective film 14 is formed. At a central portion of the surface protective film 14, an opening 15 is formed through which the anode electrode 12 is exposed. The bonding wire is joined, via the opening 15, to the anode electrode 12. The surface protective film 14 may be of a two-layered structure including a silicon nitride (SiN) film 141 formed on the anode electrode 12 and a polymide film 142 formed on the silicon nitride film 141. Preferably, the silicon nitride film 141 has a thickness of 800 nm to 2400 nm (1600 nm, for example), and the polymide film 142 has a thickness of 5 µm to 14 µm (9 µm, for example).

When the semiconductor device 1 is in a forward bias state where positive voltage is applied to the anode electrode 12 and negative voltage is applied to the cathode electrode 8, an electron (carrier) moves from the cathode electrode 8 to the anode electrode 12 via the active region 3 in the drift layer 6, and as a result, an electric current passes. Thus, the semiconductor device 1 (Schottky barrier diode) operates.

According to the semiconductor device 1, the junction portion 61 of the drift layer 6 to the Schottky metal 11 is flat or an uneven structure 13 of 5 nm or less. Thus, it is possible to reduce a forward voltage irrespective of a use environment (ambient temperature, etc.) while suppressing a leak current (reverse leakage current) passing in a reverse bias state to a comparable level as in the conventional technology.

Further, in this structure, the thickness of the Schottky metal 11 made of molybdenum is 10 nm to 150 nm (100 nm, for example), and thus, the stress (compressive stress indicated by an arrow in FIG. 3, for example) applied to the drift layer 6 from the Schottky metal 11 can be alleviated and a variation in the stress can be decreased. Thus, when the semiconductor device 1 is mass-produced, it is possible to decrease a variation in the reverse leakage current. For example, a process capability index Cpk may be 1.0 or more (preferably, 1.3 to 3.0). As a result, it is possible to stably supply the semiconductor device 1 of quality in which the reverse leakage current stays within a constant range.

The Schottky metal 11 rides on the field insulating film 10 so that the guard ring 2 extends (projects) outward with respect to the outer circumferential edge 19 of the Schottky metal 11. When a load connected to the semiconductor device 1 is inductive, if a current passing through the load is blocked, then counter-electromotive force is generated to the load. Resulting from the counter-electromotive force, reverse voltage in which the anode side is positive may apply between an anode and a cathode. In such a case, it is possible to relatively decrease a resistance value of the guard ring 2, and thus, it is possible to shorten a distance over which a current passes within the guard ring 2. Thus, it is possible to suppress heat generated by the current passing within the guard ring 2, and therefore, it is possible to prevent the device from thermally being destroyed. That is, it is possible to improve an inductive load resistance (L load resistance) of the semiconductor device 1.

Figure 4:
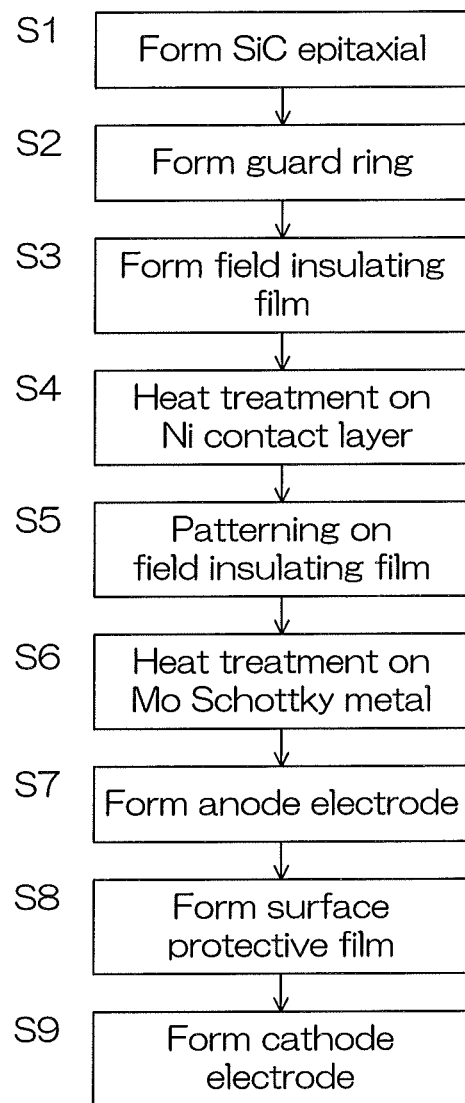
FIG. 4 is a flowchart for describing one example of a process of manufacturing the semiconductor device.

FIG. 4 is a flowchart for describing one example of a process of manufacturing the semiconductor device 1.

First, on the surface 5A of the substrate 5, the drift layer 6 is epitaxially grown (step S1). Next, by a CVD (Chemical Vapor Deposition) method, for example, a mask is formed on the surface 6A of the drift layer 6, and via the mask, an impurity is implanted toward the surface 6A of the drift layer 6. Thereafter, a heat treatment is performed on the drift layer 6, and the guard ring 2 is thereby formed selectively on the surface portion of the drift layer 6 (step S2).

Next, by a thermal oxidation method or a CVD method, for example, the field insulating film 10 that completely covers the guard ring 2 is formed on the surface 6A of the drift layer 6 (step S3). Next, by a sputtering method, for example, the nickel contact layer 7 is formed on the back surface 5B of the substrate 5. Thereafter, the substrate 5 is placed in an electric furnace, in which the nickel contact layer 7 is subjected to a heat treatment at a predetermined first temperature (step S4). It is preferable that the heat treatment on the nickel contact layer 7 is performed in an induction heater of which the interior is adjusted to a nitrogen atmosphere, for example. Next, the field insulating film 10 is patterned to form the contact hole 9, and the guard ring 2 is selectively exposed to within the contact hole 9 (step S5).

Next, by a sputtering method, for example, on the entire surface 6A of the drift layer 6, the Schottky metal 11 made of molybdenum (Mo) having a thickness of 10 nm to 150 nm is formed. Then, the substrate 5 is placed in an electric furnace, and subjected to a heat treatment at a predetermined second temperature in a state where the surface of the Schottky metal 11 is exposed (step S6). The heat treatment in a state where the surface of the Schottky metal 11 is exposed means applying a heat treatment on the Schottky metal 11 when a protective cap such as metal and a film is not formed on the surface of the Schottky metal 11. The heat treatment on the Schottky metal 11 preferably is performed, for example, in a resistance heat furnace of which the interior is adjusted to an atmosphere where there is substantially no oxygen inside the furnace (in the embodiment, a nitrogen atmosphere). If the heat treatment is performed under a nitrogen atmosphere, then the surface portion of the Schottky metal 11 is not deteriorated into molybdenum oxide due to an oxidation of the Schottky metal 11 (molybdenum) during the heat treatment. This eliminates a need for forming a protective cap on the surface of the Schottky metal 11, and thus, it is possible to prevent the Schottky metal 11 from being raised by the thickness of the protective cap. As a result, it is possible to maintain the thickness of the Schottky metal 11 to 10 nm to 150 nm.

Next, on the Schottky metal 11, the titanium layer 121 and the aluminum layer 122 are laminated in order to form the anode electrode 12 (step S7), and the surface protective film 14 is thereafter formed (step S8).

Finally, the cathode electrode 8 is formed on the nickel contact layer 7, and the semiconductor device 1 shown in FIG. 1, etc., is thereby obtained.

Although the embodiments of the present invention have heretofore been described, the present invention can be further embodied in other forms.

Figure 5:
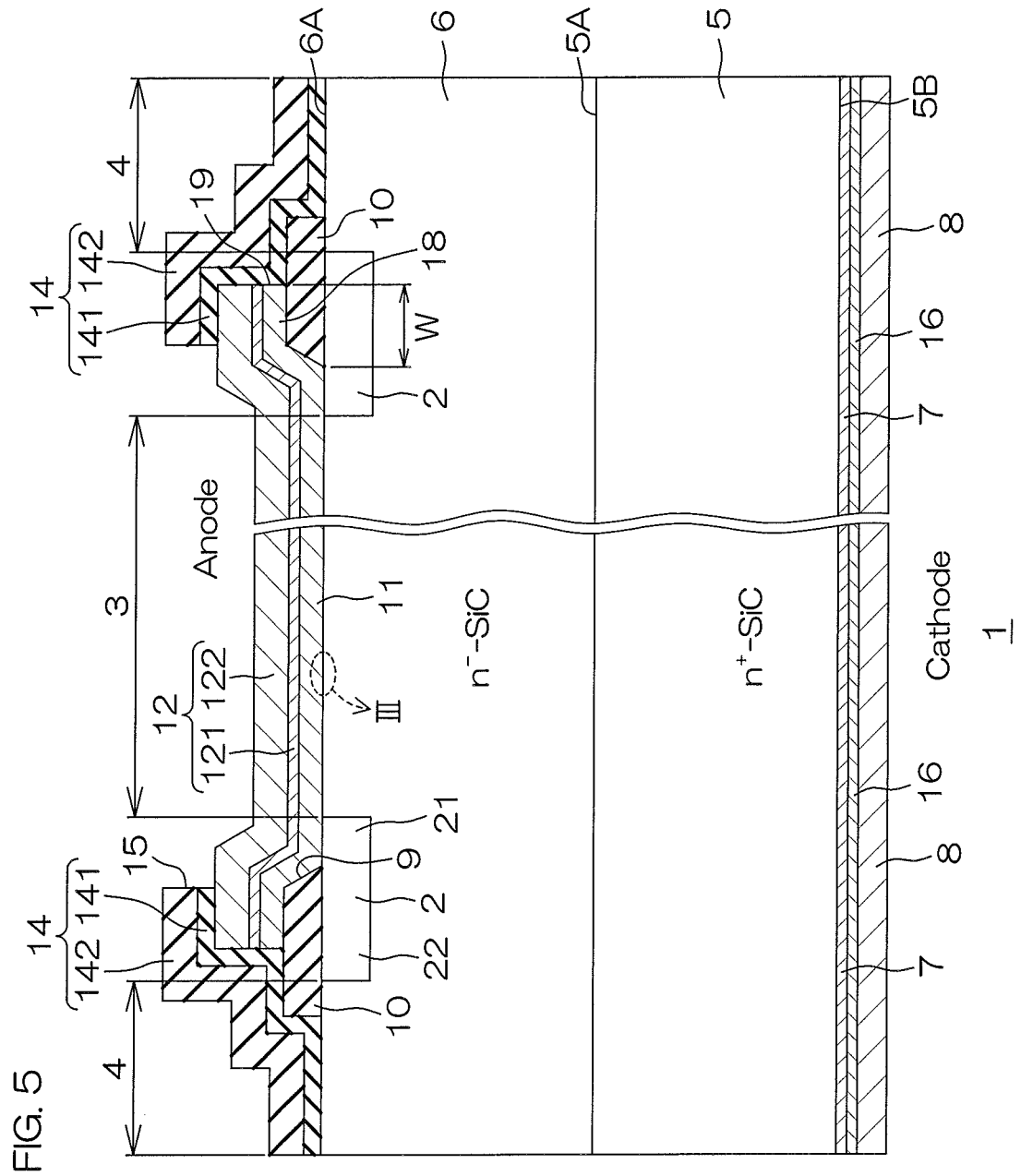
FIG. 5 is a view showing a modified embodiment of the semiconductor device in FIG. 1.
Figure 6:
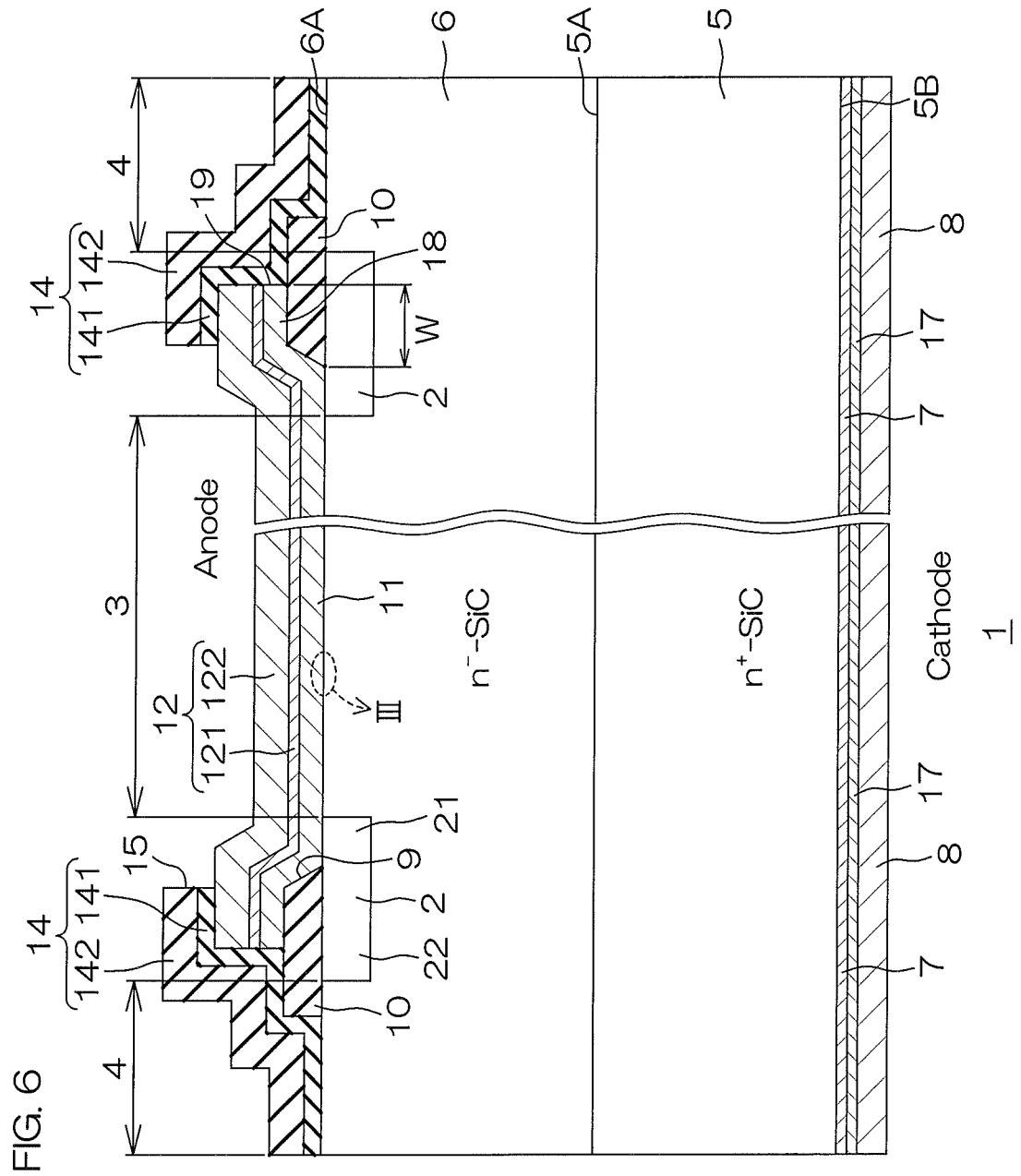
FIG. 6 is a view showing a modified embodiment of the semiconductor device in FIG. 1.
Figure 7:
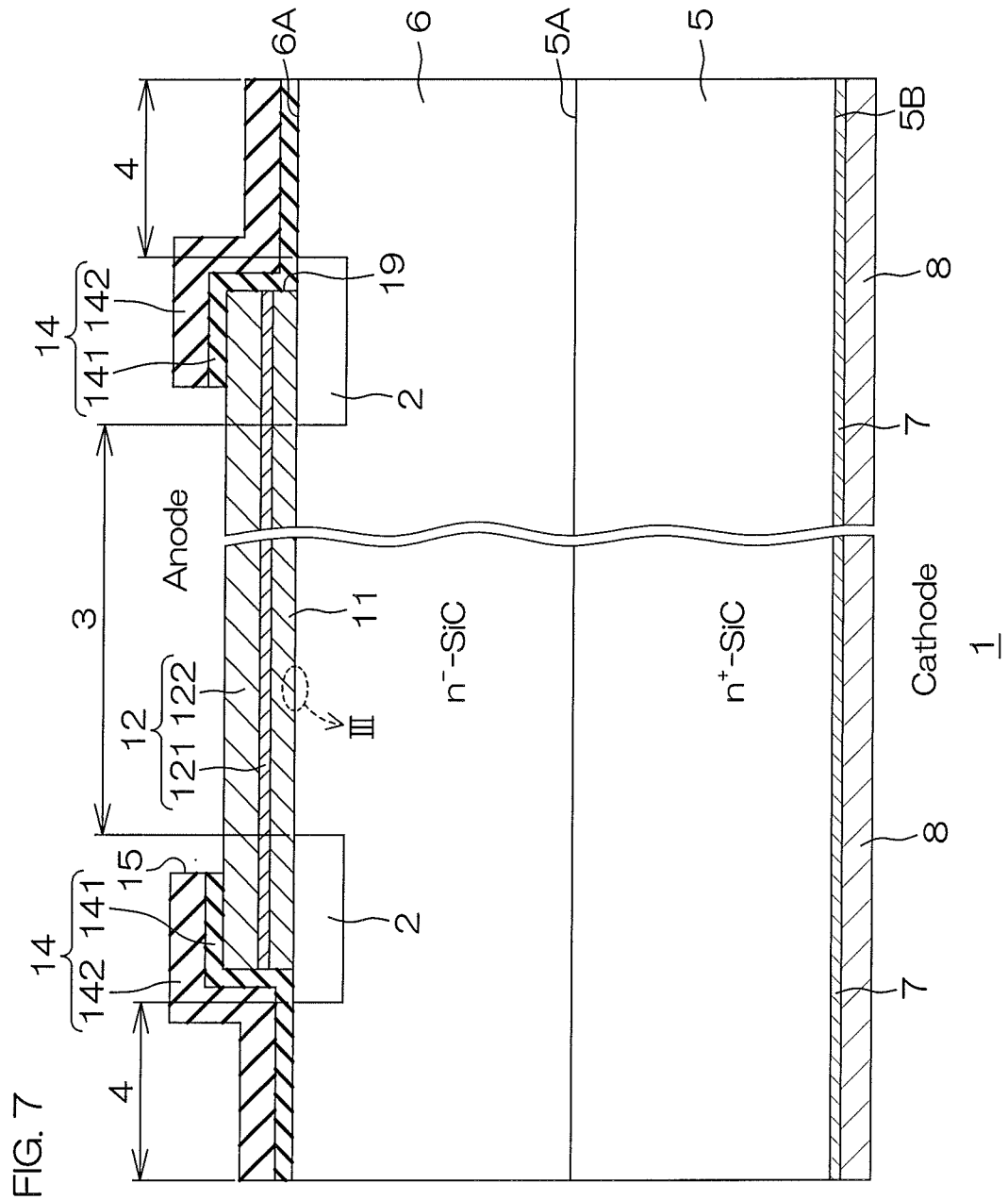
FIG. 7 is a view showing a modified embodiment of the semiconductor device in FIG. 1.

For example, the semiconductor device 1 may be embodied in a modified embodiment shown in FIG. 5 to FIG. 7.

In FIG. 5, between the nickel contact layer 7 and the cathode electrode 8, a carbon layer 16 is formed. The carbon layer 16 is formed, during the formation of nickel silicide (nickel contact layer 7) as a result of the reaction of nickel deposited on the back surface 5B of the substrate 5 with silicon in the substrate (Sic) 5 by the heat treatment in step S4 in FIG. 4, when redundant carbon (C) not contributing to the reaction is deposited on the surface of the nickel contact layer 7.

On the other hand, in FIG. 6, between the nickel contact layer 7 and the cathode electrode 8, an alloy layer 17 containing carbon is formed. The alloy layer 17 is formed when the carbon (C) made redundant during the formation of the above-described nickel silicide layer and titanium (Ti) of the cathode electrode 8 are alloyed as a result of an electrode material (Ti/Ni/Au/Ag) for the cathode electrode 8 being deposited and then subjected to a heat treatment, for example.

That is, FIG. 5 and FIG. 6 show between the nickel contact layer 7 and the cathode electrode 8, a layer resulting from the redundant carbon during the formation of the nickel silicide layer may be formed, and only one of the carbon layer 16 and the alloy layer 17 shown in each figure may be formed and both of these layers may be laminated and formed.

In FIG. 7, the field insulating film 10 is omitted, and the entire guard ring 2 is exposed to the surface 6A of the drift layer 6. A terminal end portion of the Schottky metal 11 riding on the field insulating film 10 in FIG. 2 covers across the entire circumference of the inner peripheral portion of the guard ring 2 so that the guard ring 2 extends (projects) outward with respect to the outer circumferential edge 19 of the Schottky metal 11. Thus, the terminal end portion of the Schottky metal 11 is joined to the inner peripheral portion of the guard ring 2.

For example, an arrangement obtained by inverting a conductive type of each semiconductor portion in the semiconductor device 1 may be adopted. For example, in the semiconductor device 1, the p-type portions may be n-type and the n-type portions may be p-type.

The nickel contact layer 7 may be subjected to a heat treatment in a resistance heat furnace and the Schottky metal 11 may be subjected to a heat treatment in an induction heater.

It is possible to incorporate the semiconductor device (semiconductor power device) of the present invention into a power module used for an inverter circuit arranging a drive circuit for driving an electric motor utilized as a drive source for an electric vehicle (including a hybrid car), a train, and an industrial robot, etc. It is also possible to incorporate the semiconductor device of the present invention into a power module used for an inverter circuit that makes a conversion so that power generated by a solar cell, a wind power generator, other power generators (in particular, a private power generator) is coordinated with power of a commercially-available power supply.

It is possible to combine the characteristics understood from the disclosure of the above-described embodiment even between different embodiments. Further, it is possible to combine the constituent components presented in each embodiment within the scope of the present invention.

The embodiments of the present invention are only a specific example used to clarify the technical content of the present invention, and the present invention should not be interpreted by limiting to these specific examples and the spirit and scope of the present invention are limited only by the attached scope of claims.

The present application corresponds to Japanese Patent Application No. 2012-129219 submitted on Jun. 6, 2012 to Japan Patent Office, the entire disclosure of which is incorporated herein by reference.

EXAMPLES

Next, the present invention will be described on the basis of an example and a comparative example, however, the present invention shall not be limited to the following examples.

Example 1, Comparative Example 1, and Reference Example 1

According to a flowchart in FIG. 4, 12 (in SiC wafers) semiconductor devices 1 having a structure shown in FIG. 1 were manufactured (Example 1). The thickness of the Schottky metal 11 was set to 100 nm.

On the other hand, 20 semiconductor devices were manufactured (Comparative Example 1) in much the same way as in Example 1 except that the Schottky metal 11 was subjected to a heat treatment in the same process (oxygen atmosphere) as the nickel contact layer 7 in a state where the surface of the Schottky metal 11 (molybdenum) having a thickness of 400 nm was protected with molybdenum nitride (MON) having a thickness of 200 nm. A semiconductor device arranged to have molybdenum nitride (MON) having a thickness of 200 nm on the Schottky metal 11 (molybdenum) having a thickness of 400 nm was manufactured (Reference Example 1) according to a flowchart in FIG. 4.

<Evaluation>

(1) TEM Image

A Schottky interface of the semiconductor devices obtained by the Reference Example 1 and Comparative Example 1 were photographed by TEM. The obtained images are shown in FIG. 8 and FIG. 9.

Figure 8:
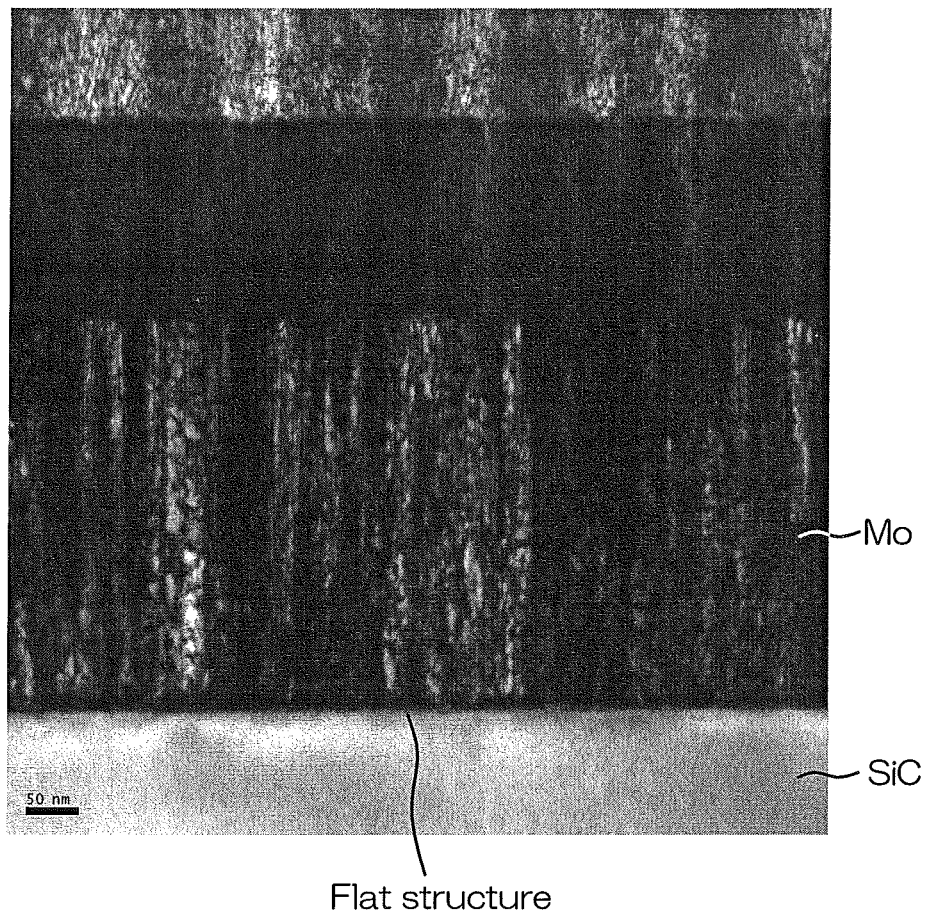
FIG. 8 is a TEM image of a Schottky interface in a Reference Example 1.

As shown in FIG. 8, it was found that in the Reference Example 1, the Schottky interface (joined portion with the Schottky metal in SiC) was a smooth flat structure. It was also found that the molybdenum (Mo) was a single crystalline structure in which the crystalline interface was not exposed. It is noted that Example 1 also had a similar structure.

Figure 9:
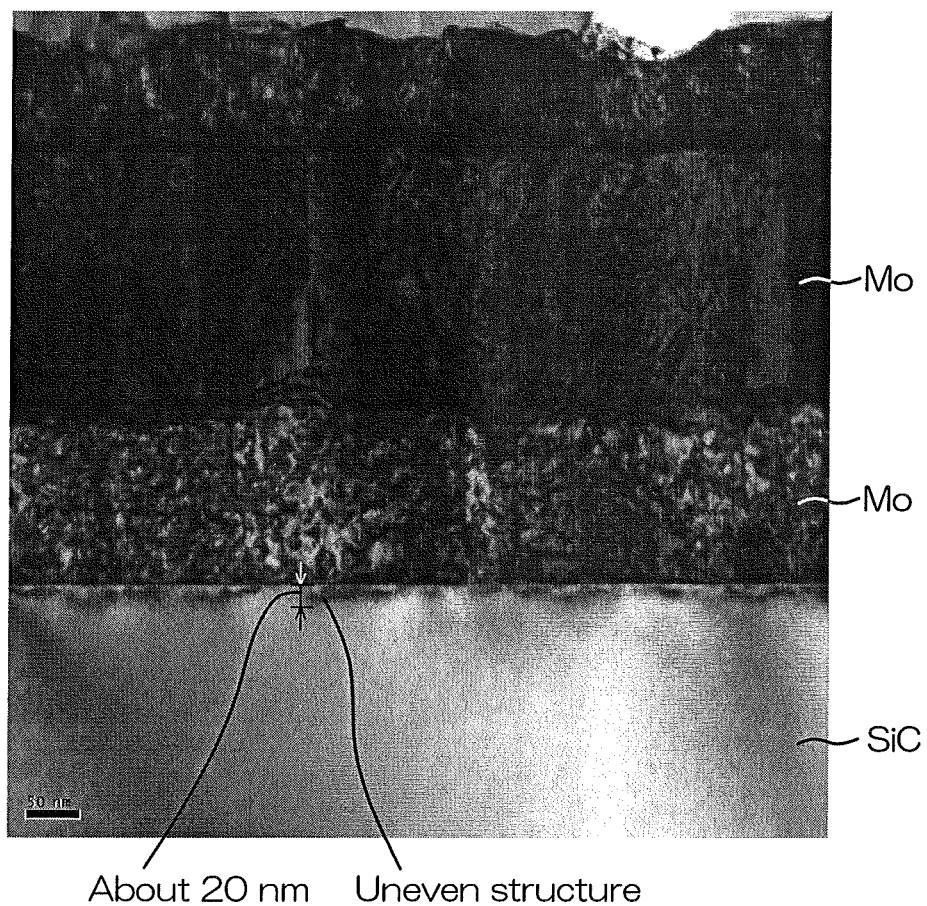
FIG. 9 is a TEM image of a Schottky interface in Comparative Example 1.

On the other hand, as shown in FIG. 9, it was found that in Comparative Example 1, an uneven structure including a plurality of recessed portions (darkish portions in FIG. 9) having a depth of about 20 nm was formed at the Schottky interface. It was also found that the crystalline interface appeared inside the molybdenum (Mo).

(2) Relationship Between Vf and Ir

Figure 10:
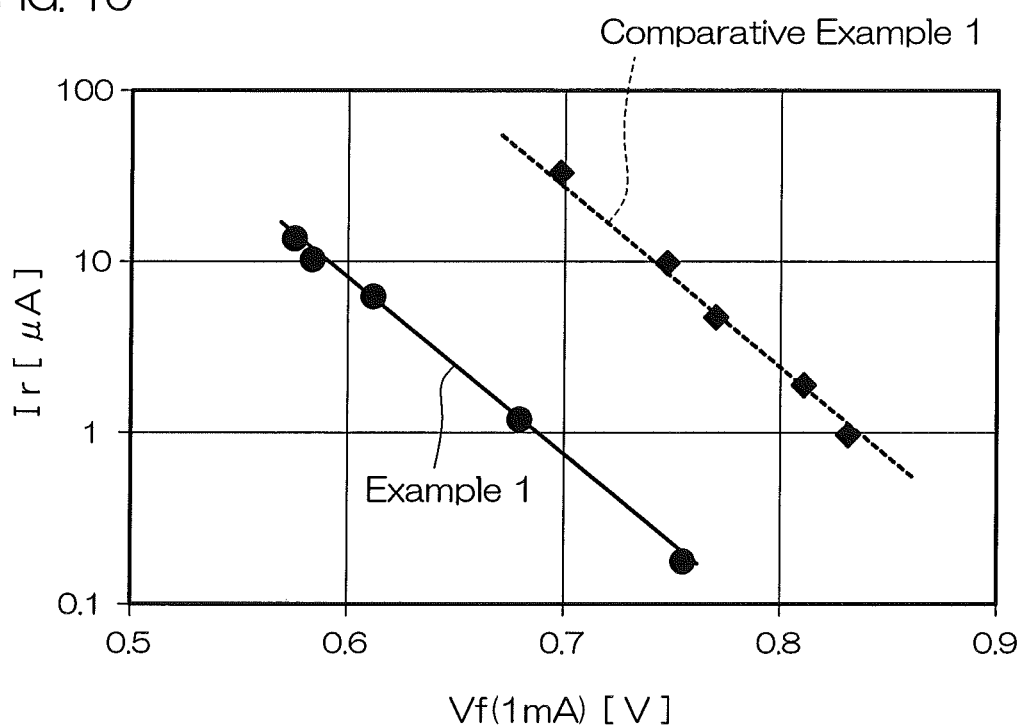
FIG. 10 is a correlation diagram between Vf and Ir of Example 1 and Comparative Example 1, respectively.

Next, in each of Example 1 and Comparative Example 1, a relationship between a forward voltage Vf (1 mA) necessary for passing forward current of 1 mA and a reverse leakage current Ir was examined. FIG. 10 is a correlation diagram between Vf and Ir of Example 1 and Comparative Example 1, respectively.

As shown in FIG. 10, it was found that in Example 1 and Comparative Example 1, there was a conflicting relationship between Vf and Ir, and when the reverse leakage current Ir was suppressed to a comparable level, Vf could be reduced in Example 1. That is, in Example 1 where the Schottky interface was flat (having a smaller amount of surface roughness), it is possible to reduce the forward voltage while suppressing the reverse leakage current to a comparable level as in Comparative Example 1.

(3) Vf-if Characteristic

Figure 11:
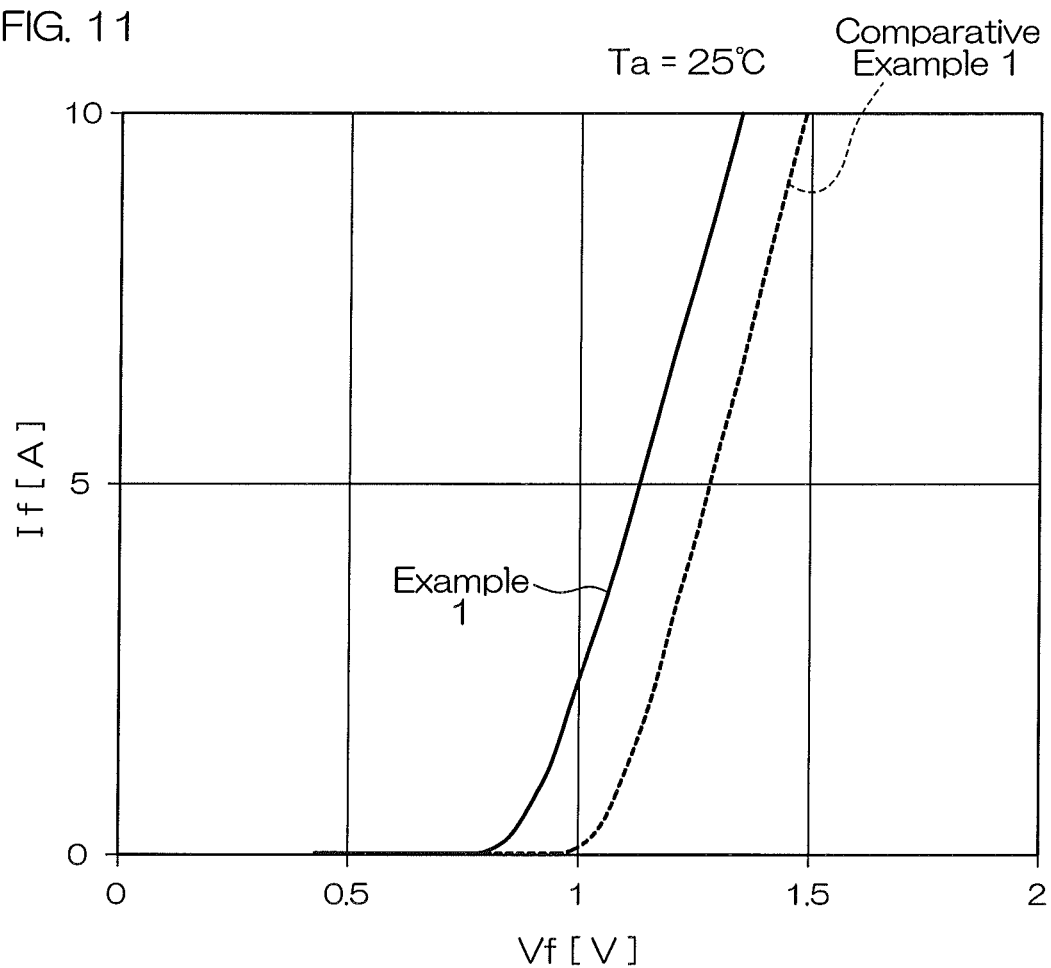
FIG. 11 shows If-Vf curves (Ta=25° C.) of Example 1 and Comparative Example 1, respectively.
Figure 12:
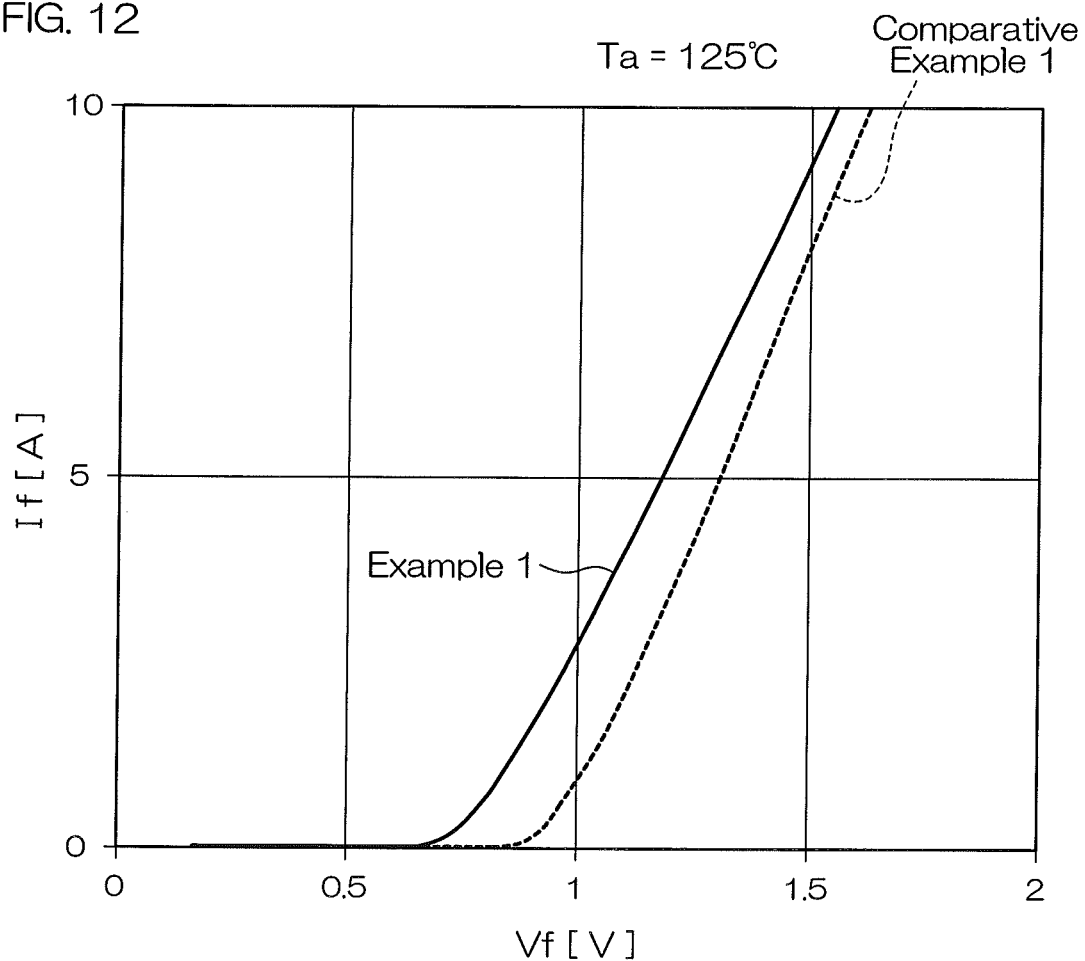
FIG. 12 shows If-Vf curves (Ta=125° C.) of Example 1 and Comparative Example 1, respectively.

Next, a Vf-If characteristic of each of Example 1 and Comparative Example 1 was examined. FIG. 11 shows If-Vf curves (Ta=25° C.) of Example 1 and Comparative Example 1, respectively. FIG. 12 shows If-Vf curves (Ta=125° C.) of Example 1 and Comparative Example 1, respectively.

As shown in FIG. 11 and FIG. 12, it was found that in temperature regions where the ambient temperature Ta was either 25° C. or 125° C., it was possible to decrease the forward voltage Vf in Example 1 as compared to Comparative Example 1.

(4) Variation in Reverse Leakage Current

The process capability index Cpk of the reverse leakage current in each of Example 1 and Comparative Example 1 was examined. As a result, it was revealed that Example 1 having Cpk=1.82 had a smaller variation in reverse leakage current than the Reference Example 1 having Cpk=0.38.

REFERENCE SIGNS LIST

1 Semiconductor device
2 Guard ring
5 Substrate
6 Drift layer
6A Surface
61 Junction portion
7 Nickel contact layer
11 Schottky metal
12 Anode electrode
121 Titanium layer
122 Aluminum layer
13 Uneven structure
16 Carbon layer
17 Alloy layer
18 Riding portion
19 Outer circumferential edge

The invention claimed is:

1. A semiconductor device, comprising:
a SiC semiconductor layer having a front surface and a rear surface;
an anode electrode having a first anode electrode layer and a second anode electrode layer, the first and second anode electrode layer being formed on a Schottky layer to define a multi-layered structure that is in contact with the front surface of the SiC semiconductor layer;
a metal layer covering the rear surface of SiC semiconductor layer;
a cathode electrode in contact with the metal layer, and
a field insulating film formed on the front surface of the SiC semiconductor layer, the field insulating film having an opening through which the multi-layered structure is in contact with the front surface of the SiC semiconductor layer, and the field insulating film including a slope and a flat portion,
wherein a Schottky junction is formed between the Schottky layer of the multi-layered structure and the front surface of the SiC semiconductor layer,
recesses are formed in a Schottky junction portion of the SiC semiconductor layer and the recesses are formed repeatedly in a cross section,
a part of the multi-layered structure is embedded in the recesses, the multi-layered structure includes the Schottky layer, the first anode electrode layer on the Schottky layer, and the second anode electrode layer on the first anode electrode layer, the Schottky layer and the first anode electrode layer are each thinner than the second anode electrode layer both on the front surface of the SiC semiconductor layer inside the opening and on an upper surface of the field insulating film, the multi-layered structure is formed over both of the slope and a part of the flat portion of the field insulating film, and a slope portion of the second anode electrode layer is formed effected with a shape of the slope portion of the field insulating film.

2. The semiconductor device according to claim 1, wherein a part of the second anode electrode layer over the flat portion of the field insulating film has a width of 10 μm or more.

3. The semiconductor device according to claim 2, wherein a thickness of the second anode electrode layer is between 60 nm to 190 nm.

4. The semiconductor device according to claim 3, wherein the field insulating film has a thickness of 0.5 μm to 3 μm.

5. The semiconductor device according to claim 4, wherein
the SiC semiconductor layer has a substrate and an epitaxial layer on the substrate, and
the substrate has a thickness of 50 μm to 600 μm.

6. The semiconductor device according to claim 5, wherein the field insulating film is made of a material including SiN.

7. The semiconductor device according to claim 6, wherein
dimensions of the semiconductor device in length and width directions in plan view are in the range of 0.5 mm to 20 mm.

8. The semiconductor device according to claim 7, wherein a thickness of the first anode electrode layer is between 10 nm to 40 nm.

9. The semiconductor device according to claim 8, further comprising:
a surface protection film covering a peripheral portion of the anode electrode and a part of the front surface of the SiC semiconductor layer.

10. The semiconductor device according to claim 9, wherein the surface protection film has a two-layered structure including a silicon nitride film and a polyimide film formed on the silicon nitride film.

11. The semiconductor device according to claim 10, further comprising:
a guard ring formed in the SiC semiconductor layer such that the guard ring surrounds the Schottky junction portion between the Schottky layer of the multi-layered structure and the front surface of the SiC semiconductor layer.

12. The semiconductor device according to claim 11, wherein the SiC semiconductor layer has a first conductive type.

13. The semiconductor device according to claim 12, wherein, the Schottky junction portion and an inner peripheral portion of the guard ring are selectively exposed through the opening of the field insulating film.

14. The semiconductor device according to claim 10, further comprising:
a guard ring formed in the SiC semiconductor layer such that the guard ring outwardly extends beyond an outer peripheral edge of the anode electrode.

15. The semiconductor device according to claim 14, wherein the field insulating film has a thickness of 0.5 μm to 3 μm.

16. The semiconductor device according to claim 8, wherein
a part of the front surface of the SiC semiconductor layer is exposed from a circumference of the field insulating film, and
the semiconductor device includes a surface protection film covering a peripheral portion of the anode electrode and the exposed part of the front surface of the SiC semiconductor layer.

17. The semiconductor device according to claim 16, wherein each recess has a depth shallower than 20 nm.

18. The semiconductor device according to claim 16, wherein the recesses have a depth not greater than 20 nm and are irregularly arranged on the SiC semiconductor layer.

19. The semiconductor device according to claim 8, further comprising:
a surface protection film covering a peripheral portion of the anode electrode and a part of the front surface of the SiC semiconductor layer,
wherein an edge portion of the surface protection film reaches a side end surface of the SiC semiconductor layer.

20. The semiconductor device according to claim 1, wherein the slope portion of the second anode electrode layer is positioned at least at a boundary between the first and second anode electrode layers.

* * * * *